(12) United States Patent
Sato

(10) Patent No.: US 7,888,161 B2
(45) Date of Patent: Feb. 15, 2011

(54) SOLID-STATE IMAGING DEVICE AND METHOD FOR PRODUCING THE SAME

(75) Inventor: Takanori Sato, Miyagi (JP)

(73) Assignee: Fujifilm Corporation, Tokyo (JP)

( * ) Notice: Subject to any disclaimer, the term of this patent is extended or adjusted under 35 U.S.C. 154(b) by 104 days.

(21) Appl. No.: 12/429,839

(22) Filed: Apr. 24, 2009

(65) Prior Publication Data

US 2009/0215217 A1    Aug. 27, 2009

Related U.S. Application Data

(62) Division of application No. 11/517,487, filed on Sep. 8, 2006, now abandoned.

(30) Foreign Application Priority Data

Sep. 12, 2005 (JP) .......................... P2005-263749

(51) Int. Cl.
*H01L 21/00* (2006.01)

(52) U.S. Cl. .............. 438/72; 438/57; 438/59; 438/60; 438/69; 438/70; 438/71; 257/183.1; 257/184; 257/215; 257/222; 257/223; 257/225; 257/226; 257/229; 257/230; 257/290; 257/291; 257/294; 257/437

(58) Field of Classification Search ................. 438/57, 438/59, 60, 69, 70, 71, 72; 257/183.1, 184, 257/215, 222, 223, 225, 226, 229, 230, 290, 257/291, 294, 437
See application file for complete search history.

(56) References Cited

U.S. PATENT DOCUMENTS

| 5,565,374 | A | 10/1996 | Fukusho |
| 5,578,842 | A * | 11/1996 | Shinji .......................... 257/223 |
| 5,585,653 | A | 12/1996 | Nakashiba |
| 5,736,756 | A * | 4/1998 | Wakayama et al. ......... 257/223 |
| 5,844,290 | A * | 12/1998 | Furumiya .................... 257/432 |
| 6,133,595 | A | 10/2000 | Senda |
| 6,468,826 | B1 | 10/2002 | Murakami et al. |
| 6,518,639 | B2 | 2/2003 | Ueno et al. |
| 7,084,443 | B2 | 8/2006 | Kitano et al. |
| 2002/0195628 | A1 | 12/2002 | Yamada |
| 2003/0122209 | A1 | 7/2003 | Uya |
| 2004/0185596 | A1* | 9/2004 | Tanigawa ..................... 438/69 |

FOREIGN PATENT DOCUMENTS

JP         2004-140309 A      5/2004

* cited by examiner

*Primary Examiner*—Kevin M Picardat
*Assistant Examiner*—Bac H Au
(74) *Attorney, Agent, or Firm*—Birch, Stewart, Kolasch & Birch, LLP

(57) ABSTRACT

A method for producing a solid-state imaging device, which including: a photoelectric conversion section; a charge transfer section having a charge transfer electrode; and an antireflection film covering a light-receiving region in the photoelectric conversion section, wherein forming the antireflection film includes: forming a sidewall on a lateral wall of the charge transfer electrode after forming the charge transfer electrode; forming an antireflection film on a substrate surface where the sidewall is formed; forming a resist on the antireflection film; melting and flattening the resist to expose the antireflection film on the charge transfer electrode; removing the antireflection film by using the resist as the mask; removing the sidewall; covering the charge transfer electrode with an insulating film; and forming a light-shielding film that reaches a level lower than the top surface of the antireflection film, and that surrounds the periphery of the antireflection film.

8 Claims, 8 Drawing Sheets

SOLID-STATE IMAGING DEVICE AND METHOD FOR PRODUCING THE SAME

CROSS REFERENCE TO RELATED APPLICATIONS

This application is a Divisional of application Ser. No. 11/517,487, filed on Sep. 8, 2006, now abandoned the entire contents of which are hereby incorporated by reference and for which priority is claimed under 35 U.S.C. §120.

BACKGROUND OF THE INVENTION

1. Field of the Invention

The present invention relates to a solid-state imaging device and a production method thereof, more specifically, the present invention relates to a charge transfer electrode of a solid-state imaging device.

2. Background Art

The solid-state imaging device utilizing a charge coupled device (CCD) used for an area sensor and the like has a photoelectric conversion section comprising a photodiode or the like and a charge transfer section equipped with a charge transfer electrode for transferring a signal charge from the photoelectric conversion section. As for the charge transfer electrode, plural charge transfer electrodes are adjacently disposed on a charge transfer path formed on a semiconductor substrate and sequentially driven.

With the recent downsizing of a camera, demands for high resolution and high sensitivity of a solid-state imaging device are more and more increasing, and the number of imaging pixels has been increased to gigapixels or more.

In order to elevate the sensitivity, there is employed a method where a high refractive index film for antireflection is formed on a photodiode (photoelectric conversion section) and for the purpose of reducing smears, the region except for the top of the photoelectric conversion section is light-shielded by using a tungsten light-shielding film having an opening in the photoelectric conversion section.

For example, a method of forming an antireflection film to cover the light-receiving region of the photoelectric conversion section and after patterning, forming a light-shielding film thereon has been proposed.

According to this structure, a light-shielding film 7 can be formed to unfailingly cover the charge transfer section, but since a silicon oxide film is formed below the light-shielding film so as to ensure electrical withstand voltage with the charge transfer electrode, there is a problem that multiple reflection is generated between the light-shielding film and the silicon substrate, and the obliquely incident light run into the charge transfer path worsens the smear. The smear is a phenomenon such that when strong light is irradiated on a solid-state imaging device, the light reaches the charge transfer section and due to an electric charge generated therein, a band-like imaging defect appears on the screen. Therefore, in increasing the number of pixels, it becomes an important problem to cover the charge transfer section with a light-shielding film and thoroughly open the opening of the photoelectric conversion section.

To solve this problem, a method of forming a light-shielding film below the antireflection film has been proposed. However, also in this case, in order to ensure electrical withstand voltage between the tungsten light-shielding film and the charge transfer electrode, an insulating film such as silicon oxide film needs to be formed below the light-shielding film.

Consequently, a method of forming a pattern of an antireflection film to cover the top of the photoelectric conversion section, and forming a light-shielding film to self-align with the edge thereof has been proposed in JP-A-2004-140309 (the term "JP-A" as used herein means an "unexamined published Japanese patent application").

In this method, as seen in FIGS. 8A to 8E showing the production process thereof, a silicon oxide film as a flattening film 10 is formed on an antireflection film 5 and patterned by lithography to selectively remain only on the photodiode region, and a light-shielding film 9 is then formed.

According to this structure, a light-shielding film 9 can be formed to unfailingly cover the charge transfer section, thereby eliminating the effect of smears, and a high-sensitivity low-smear solid-state imaging device can be provided.

However, this method requires to take an alignment margin of the photolithography, and this stands as an obstacle hampering microfabrication.

As shown in FIG. 8C, the flattening film formed on the antireflection film needs to be patterned by photolithography. In this photolithography process, overlap accuracy is required and if inaccurate, the sensitivity is greatly reduced.

That is, there is a problem that despite the need for extremely high-level overlap accuracy, enhancement of the overlap accuracy by photolithography is very difficult.

In this way, in the conventional solid-state imaging device shown in FIGS. 8A and 8E, displacement at the patterning of an antireflection film and a flattening film is a serious problem and sometimes causes fluctuation of sensitivity or worsening of smears.

SUMMARY OF THE INVENTION

The present invention has been made under these circumstances and an object of the present invention is to form an island-like antireflection film on a photodiode without unduly securing the overlap accuracy in the patterning of the antireflection film.

Another object of the present invention is to provide a high-sensitivity low-smear sensor in which an antireflection film with a required area can be self-alignedly formed on a photodiode.

(1) According to a first aspect of the present invention, a method for producing a solid-state imaging device, which comprises: a photoelectric conversion section; a charge transfer section having a charge transfer electrode for transferring an electric charge generated in the photoelectric conversion section; and an antireflection film covering a light-receiving region in the photoelectric conversion section, wherein forming the antireflection film comprises: forming a sidewall on a lateral wall of the charge transfer electrode after forming the charge transfer electrode; forming an antireflection film on a substrate surface where the sidewall is formed; forming a resist on the antireflection film; melting and flattening the resist to expose the antireflection film on the charge transfer electrode; removing the antireflection film by using the resist as the mask; removing the sidewall; covering the charge transfer electrode with an insulating film; and forming a light-shielding film that reaches a level lower than the top surface of the antireflection film, and that surrounds the periphery of the antireflection film.

According to this constitution, the patterning of the antireflection film is self-alignedly performed through a sidewall with respect to the charge transfer electrode, so that remarkably high-precision patterning can be attained without causing displacement or the like in the photolithography process and the sensor area can be maximally utilized to allow for realization of high sensitivity and low smearing.

(2) The method for producing the solid-state imaging device as described in the item (1), wherein the forming of the light-shielding film comprises patterning by photolithography after the forming of the light-shielding film.

According to this constitution, the patterning of the light-shielding film is performed by the use of photolithography, so that the reliability can be more enhanced.

(3) The method for producing the solid-state imaging device as described in the item (1) or (2), which comprises, etching at least a part of an gate oxide film on the photoelectric conversion section by using the charge transfer electrode as the mask, the etching performing in advance of the forming of the sidewall.

According to this constitution, the gate oxide film on the photoelectric conversion section is removed, so that the antireflection film can be formed in more proximity to the substrate and the bottom level of the light-shielding film can in turn descend to a lower position, as a result, a structure capable of more unfailingly preventing intrusion of light can be provided.

(4) The method for producing the solid-state imaging device as described in the item (3), wherein the etching of the gate oxide film is exposing the substrate surface.

By virtue of this constitution, the antireflection film can be formed at a lower position and the intrusion of light can be more unfailingly prevented.

(5) The method for producing the solid-state imaging device as described in the item (4), which comprises, covering the substrate surface with an oxide film by a radical oxidation using a low-temperature plasma after the exposing of the substrate surface.

By virtue of this constitution, a high-quality silicon oxide film can be formed at a low temperature and a high-precision highly reliable solid-state imaging device can be fabricated while suppressing the extension of diffusion length in the device region formed within the substrate.

(6) The method for producing the solid-state imaging device as described in any of the items (1) to (5), wherein the forming of the sidewall comprises forming a polycrystalline silicon layer by a chemical vapor deposition (CVD) method.

By virtue of this constitution, the sidewall can be efficiently formed at a low temperature.

(7) The method for producing the solid-state imaging device as described in the item (1), wherein the forming of the insulating film comprises forming a silicon oxide film by a radical oxidation using a low-temperature plasma.

By virtue of this constitution, a dense and high-quality silicon oxide film can be formed at a low temperature between the light-shielding film and the charge transfer electrode and similarly to the above, a high-precision highly reliable solid-state imaging device can be fabricated while suppressing the extension of diffusion length in the device region.

(8) The method for producing the solid-state imaging device as described in the item (1), wherein the step of forming an antireflection film is a step of forming a silicon nitride film.

By virtue of this constitution, a dense and highly reliable antireflection film can be formed.

(9) According to a second aspect of the present invention, a solid-state imaging device comprising: a photoelectric conversion section; a charge transfer section having a charge transfer electrode for transferring an electric charge generated in the photoelectric conversion section; an antireflection film covering a light-receiving region of the photoelectric conversion section; and a light-shielding film reaching a level lower than the top surface of the antireflection film, and surrounding the periphery of the antireflection film.

By virtue of this constitution, a high-precision high-sensitivity solid-state imaging device capable of blocking intrusion of light into the charge transfer section due to multiple reflection can be provided.

(10) The solid-state imaging device as described in the item (9), wherein at least a part of the gate oxide film formed in the charge transfer section is removed on the photoelectric conversion section.

According to this constitution, the gate oxide film on the photoelectric conversion section is removed, so that the antireflection film can be formed in more proximity to the substrate and the bottom level of the light-shielding film can in turn descend to a lower position, as a result, a structure capable of more unfailingly preventing intrusion of light can be provided.

(11) The solid-state imaging device as described in the item (10), wherein the gate oxide film is removed on the surface of the photoelectric conversion section, and an antireflection film is formed on the surface of the photoelectric conversion section through a radical oxide film provided by using a low-temperature plasma.

By virtue of this constitution, dense and highly reliable insulation can be achieved.

(12) The solid-state imaging device as described in the item (9), wherein a silicon oxide film formed by a radical oxidation using a low-temperature plasma is intervening between the antireflection film and the light-shielding film.

(13) The solid-state imaging device as described in the item (9), wherein the antireflection film is a silicon nitride film.

(14) The solid-state imaging device as described in the item (9), wherein the light-shielding film is tungsten.

(15) The solid-state imaging device as described in the item (14), wherein the tungsten film is formed through a titanium nitride layer.

According to the present invention, high-level overlap accuracy is not necessary and in turn, an expensive exposure apparatus is not required, so that the production cost can be reduced.

Also, the island-like antireflection film shape intended to form on the photoelectric conversion section can be adjusted to the width of polysilicon sidewall, that is, the film thickness of deposit, so that self-aligning constitution can be established.

Furthermore, the insulating film and the like are formed by radical oxidation using a low-temperature plasma, so that extension of the diffusion length of an impurity in the device region can be suppressed and the light-shielding film can be reduced in the distance to the substrate by virtue of the descending of its bottom level, as a result, multiple reflection of obliquely incident light can be prevented.

BRIEF DESCRIPTION OF THE DRAWINGS

The invention disclosed herein will be understood better with reference to the following drawings of which.

DETAILED DESCRIPTION OF THE INVENTION

Figure 1:
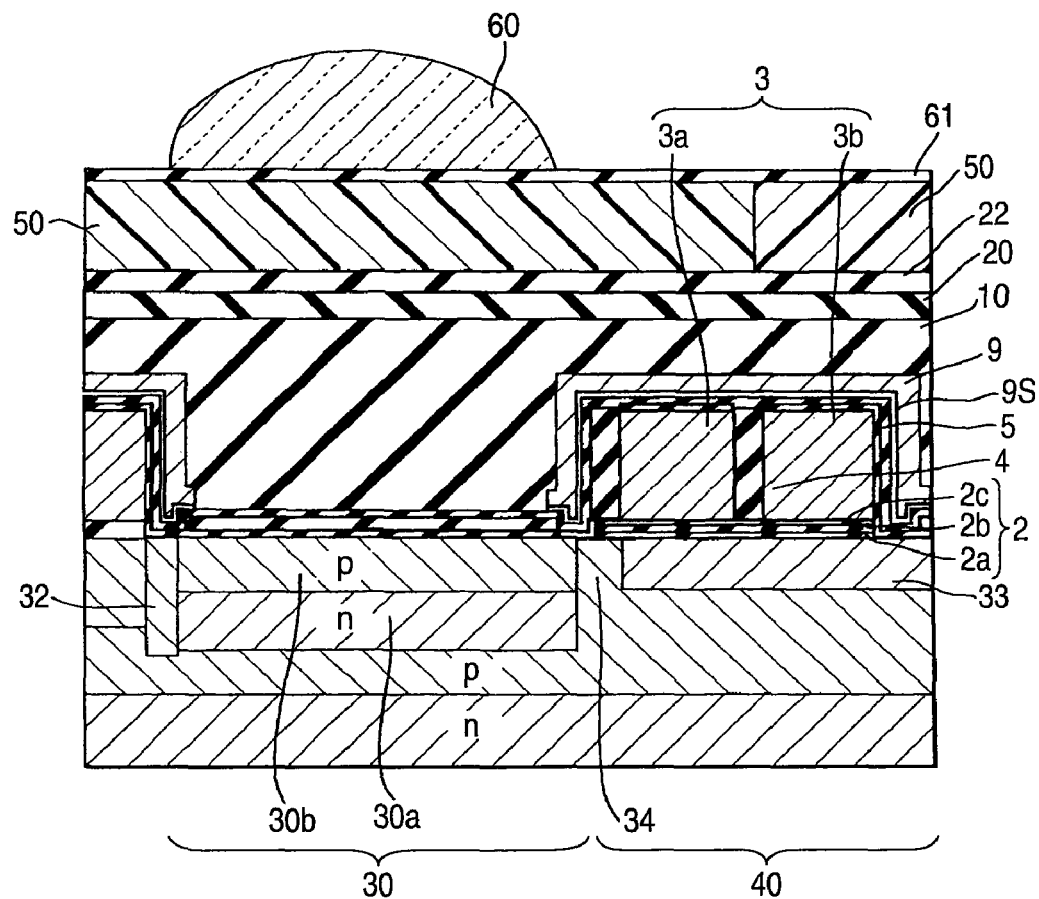
FIG. 1 is a cross-sectional view that illustrates the solid-state imaging device according to the first embodiment of the present invention.

The exemplary embodiments of the present invention are described below by referring to the drawings.

Embodiment 1

Figure 2:
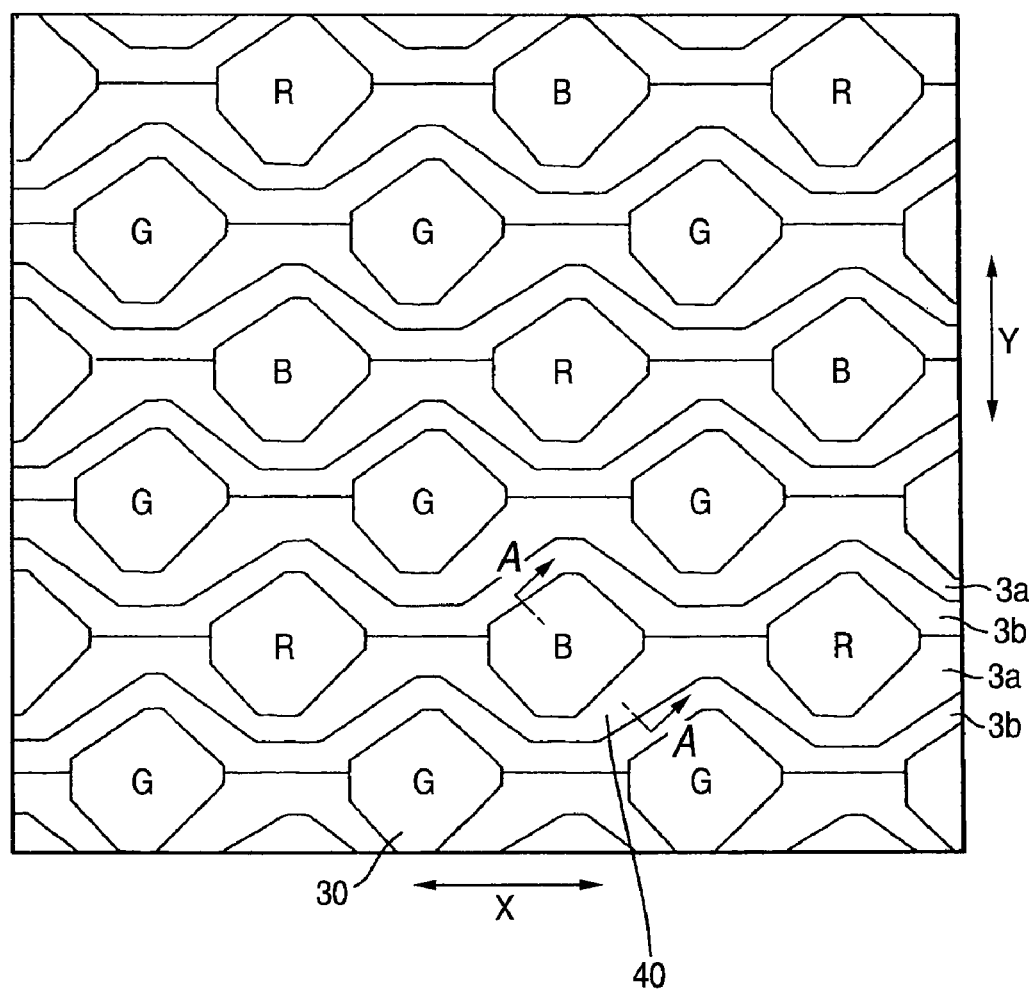
FIG. 2 is a top view that illustrates the solid-state imaging device according to the first embodiment of the present invention.

This solid-state imaging device has, as shown in FIGS. 1 and 2, a photoelectric conversion section, a charge transfer section equipped with a charge transfer electrode for transferring an electric charge generated in the photoelectric conversion section, and an antireflection film 7 formed in the photoelectric conversion section, wherein a light-shielding film covering the charge transfer electrode is formed to reach a level lower than the top surface of the antireflection film 7 and surround the periphery of the antireflection film. By virtue of this constitution, a high-precision high-sensitivity solid-state imaging device capable of blocking intrusion of light into the charge transfer section due to multiple reflection can be provided. Here, the antireflection film is composed of a silicon nitride film, and its top and bottom layers are covered with an insulating film comprising a silicon oxide film using a low-temperature plasma. FIG. 1 is a cross-sectional schematic view, and FIG. 2 is a plan schematic view. FIG. 1 is an A-A cross-sectional view of FIG. 2.

Other structures are the same as those of the normal solid-state imaging device. That is, as shown in FIG. 1, a photoelectric conversion section 30 (30a, 30b) constituting a photodiode, a charge transfer channel 33, a channel stop region 32 and a charge read-out region 34 are formed within a silicon substrate 1, and a gate oxide film 2 is formed on the surface of the silicon substrate 1.

Incidentally, this gate oxide film 2 is constituted by a three-layer structure film consisting of a silicon oxide film 2a, a silicon nitride film 2b and a silicon oxide film 2c. On the photoelectric conversion section 30, all films of the gate oxide film 2 are removed, and a silicon nitride film 7 as an antireflection film and a silicon oxide film 8 provided by radical oxidation using a low-temperature plasma are formed on a silicon oxide film 5 provided by radical oxidation using a low-temperature plasma. These silicon oxide films 5 and 8 each is formed to integrally covering from the photoelectric conversion section to the top of the charge transfer section.

On the surface of the gate oxide film 2, charge transfer electrodes (a first layer electrode comprising a first electrically conducting film 3a and a second layer electrode comprising a second layer electrically conducting film 3b) are formed and juxtaposed with intervention of an interelectrode insulating film 4, thereby constructing a single-layer electrode structure. Also, a flattening film 10 comprising a BPSG (borophosphosilicate glass) film filled in the photoelectric conversion section to give a nearly flat surface is formed below a light-shielding film 9 comprising a tungsten film formed to have an opening in the photoelectric conversion section 30. On the flattening film 10, a flattening film consisting of a silicon nitride film 20 and a light-transparent film 22 comprising an organic film is provided. Furthermore, a filter 50 and a lens 60 are formed on this flattening film. The numeral 61 is a flattening film on filter.

By virtue of such a constitution, good surface flattening and great reduction in the thickness can be achieved.

The charge transfer channel allowing for travelling of the signal charge transferred by the charge transfer electrode is not shown in FIG. 2 but is formed in the direction intersecting with the direction to which the charge transfer section 40 is extending.

As for the interelectrode insulating film, those formed in the vicinity of the boundary between the photodiode region 30 and the charge transfer section 40 are omitted in FIG. 2.

In this Example, a solid-state imaging device having a so-called honeycomb structure is shown, but these are of course applicable also to a square lattice-type solid-state imaging device.

The production process of this solid-state imaging device is described in detail below by referring to FIGS. 3A to 7C.

First, a photoelectric conversion section and a charge transfer section are formed by a normal method on a silicon substrate 1 having formed therein a p-well 1P. For example, the charge transfer section is formed as follows. On the surface of an n-type silicon substrate 1 having an impurity concentration of about $1.0 \times 10^{16}$ cm$^{-3}$, a silicon oxide film 2a having a film thickness of 25 nm, a silicon nitride film 2b having a film thickness of 50 nm and a silicon oxide film 2c having a film thickness of 10 nm are formed to constitute a gate oxide film 2 having a three-layer structure.

Subsequently, a first layer polycrystalline silicon film 3a is formed on the gate oxide film 2 and after patterning, surface oxidation is performed to form an interelectrode insulating film 4 comprising a silicon oxide film. Furthermore, a second layer polycrystalline silicon film 3b is formed and patterning is performed.

Figure 3A:
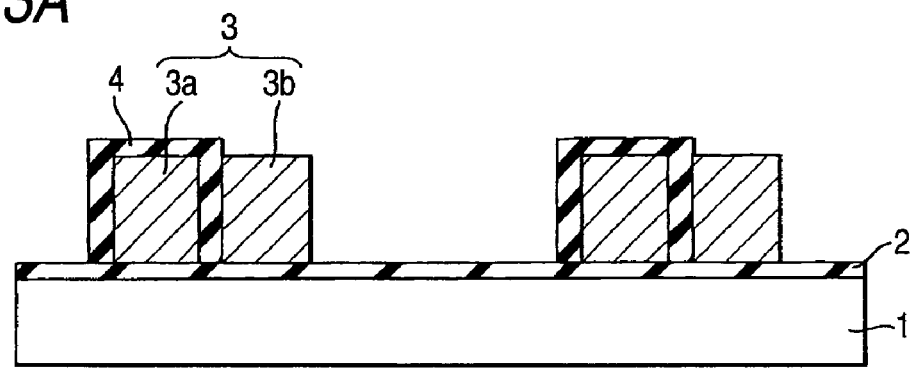
FIGS. 3A to 3C are views that illustrate the production process of the solid-state imaging device according to the first embodiment of the present invention.
Figure 3B:
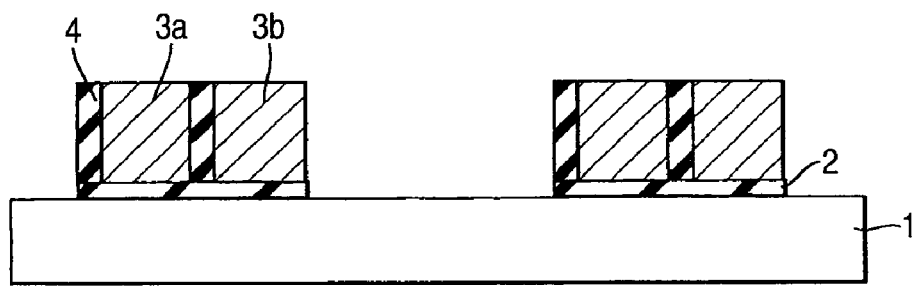

Then, the surfaces of the first layer polycrystalline silicon film 3a and the second layer polycrystalline silicon film 3b are exposed by a chemical mechanical polishing (CMP) (FIG. 3B).

Figure 3C:
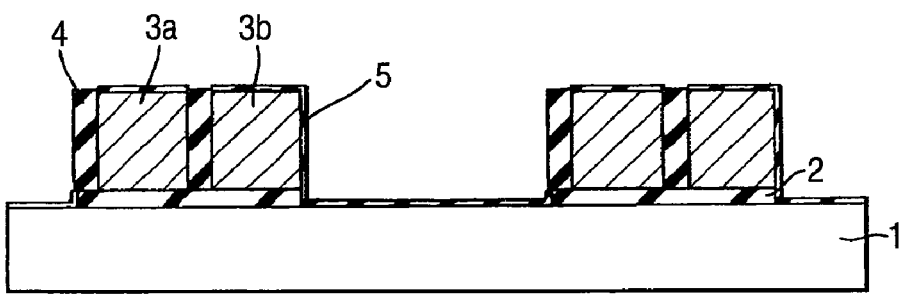
Figure 4A:
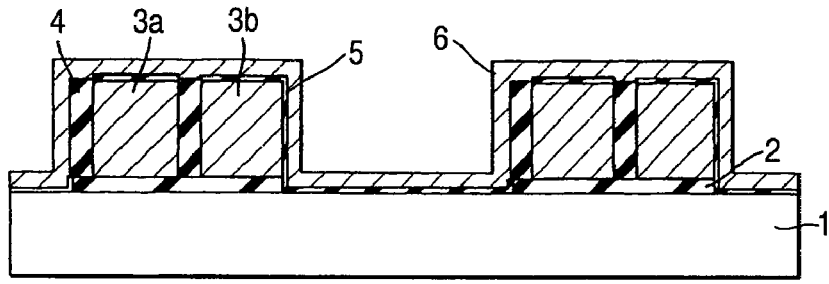
FIGS. 4A to 4D are views that illustrate the production process of the solid-state imaging device according to the first embodiment of the present invention.

Thereafter, a silicon oxide film 5 having a film thickness of approximately from 10 to 40 nm is formed by radical oxidation using a low-temperature plasma (FIG. 3C). In this state, an n-layer 30a and a p-layer 30b are formed by ion injection for the formation of a photodiode. Furthermore, a polycrystalline silicon film 6 is formed by a CVD process (FIG. 4A).

Figure 4B:
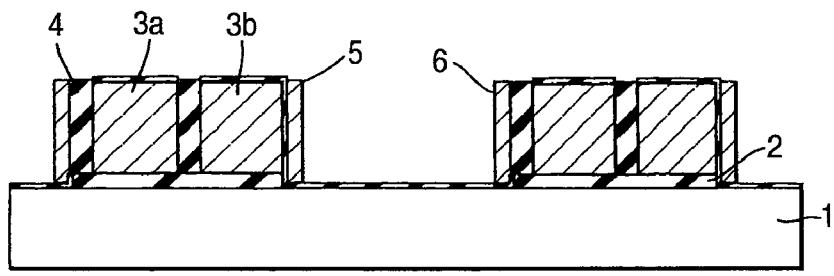

Subsequently, a sidewall (polycrystalline silicon film) 6 is formed by anisotropic etching of leaving the polycrystalline silicon film 6 on the lateral wall of the charge transfer electrode (FIG. 4B).

Figure 4C:
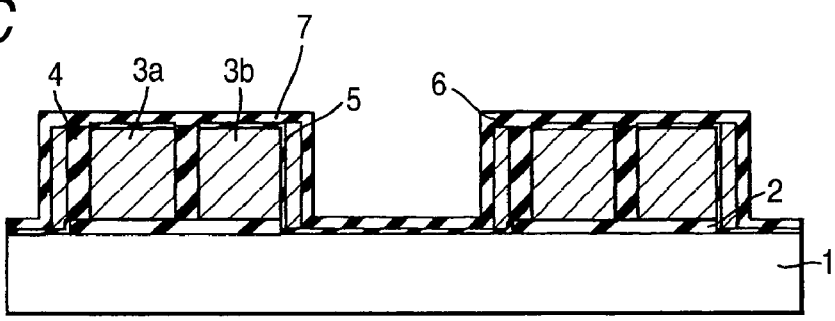
Figure 4D:
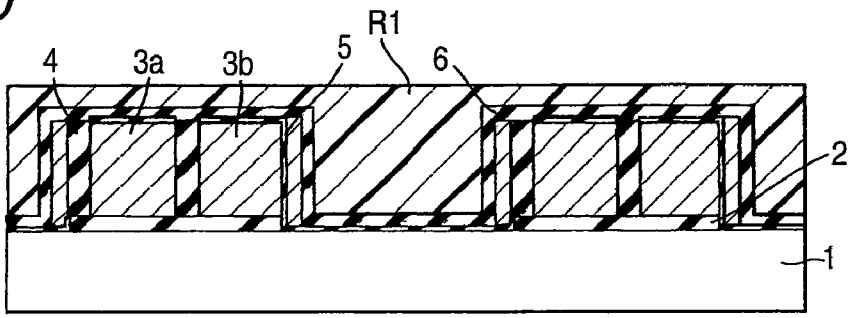

Then, a silicon nitride film as an antireflection film 7 is formed by a chemical vapor deposition method (FIG. 4C).

Figure 5A:
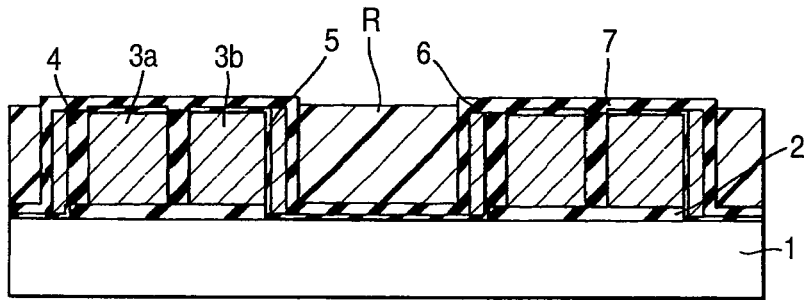
FIGS. 5A to 5D are views that illustrate the production process of the solid-state imaging device according to the first embodiment of the present invention.

Furthermore, a resist R1 is coated (FIG. 4D) and by heating and fluidizing the resist, the silicon nitride film 7 as an antireflection film on the electrode section is exposed (FIG. 5A).

Figure 5B:
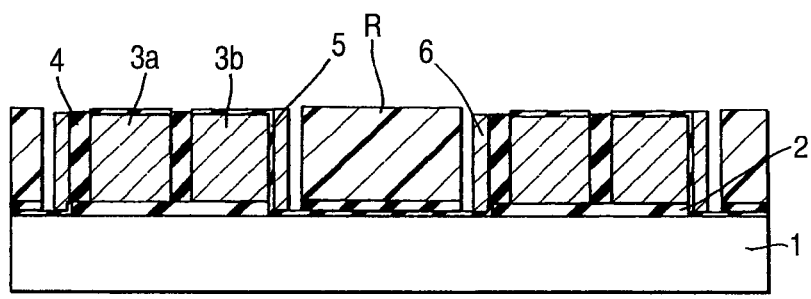
Figure 5C:
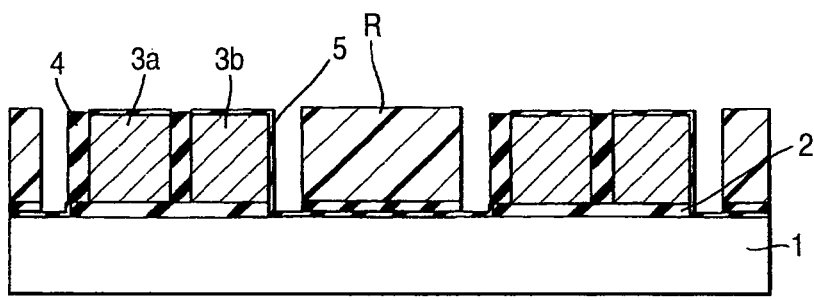

The silicon nitride film is etched by isotropic etching using oxygen as the main component to allow for remaining of the antireflection film 7 below the resist R1 (FIG. 5B).

Figure 5D:
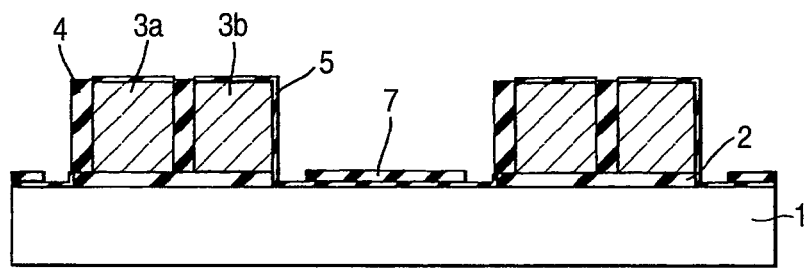

The sidewall (polycrystalline silicon film) 6 is removed by isotropic etching using a fluorine gas (FIG. 5C) and then, the resist R1 is ashed and removed by RIE (Reactive Ion Etching) using oxygen, whereby the antireflection film 7 is patterned self-alignedly with respect to the charge transfer electrode (FIG. 5D). After the ashing, the etching residue is preferably removed by performing a wet treatment with aqueous hydrogen peroxide.

Figure 6A:
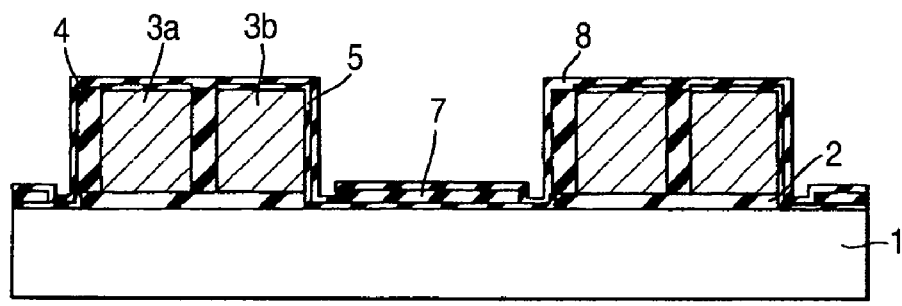
FIGS. 6A and 6B are views that illustrate the production process of the solid-state imaging device according to the first embodiment of the present invention.
Figure 6B:
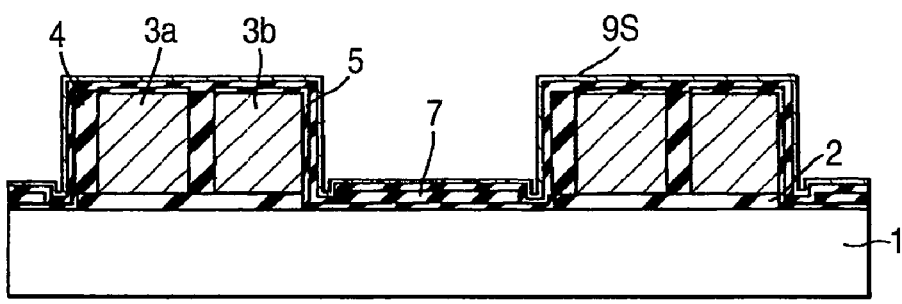

On the thus-formed antireflection film 7, a silicon oxide film 8 having a film thickness of about 50 nm is formed by radical oxidation using a low-temperature plasma (FIG. 6A).

Furthermore, a TiN layer 9S as an adhesion layer is formed (FIG. 6B) and then, a light-shielding film 9 is formed.

Figure 7A:
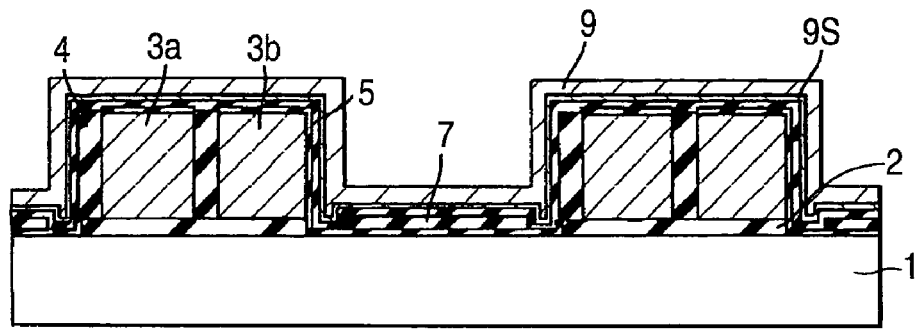
FIGS. 7A to 7C are views that illustrate the production process of the solid-state imaging device according to the first embodiment of the present invention.
Figure 7B:
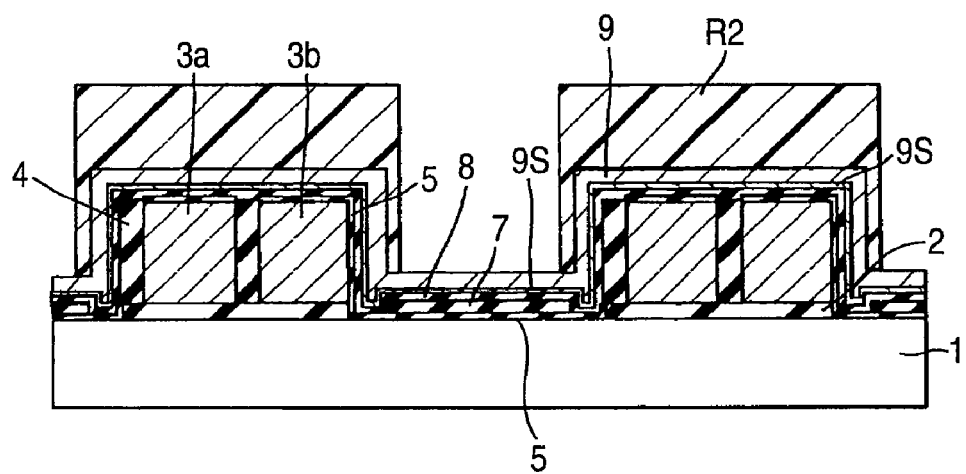
Figure 7C:
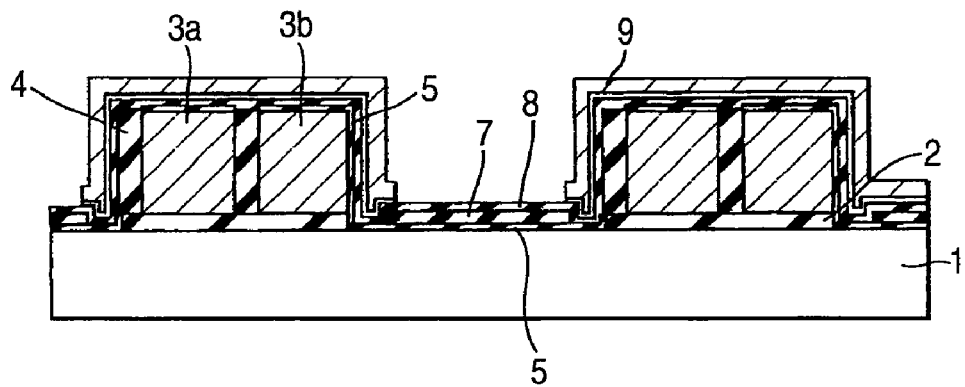
Figure 8A:
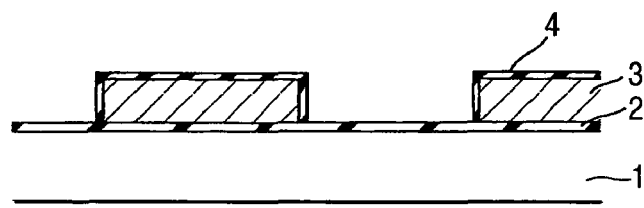
FIGS. 8A to 8E are views that illustrates the production process of the solid-state imaging device according to the conventional technique.
Figure 8B:
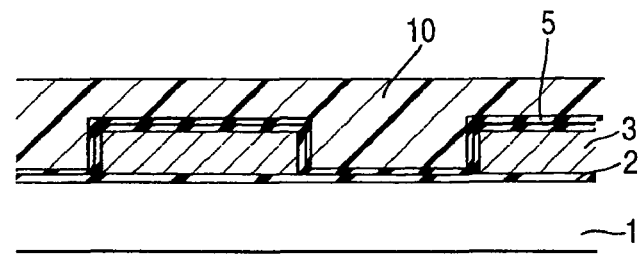
Figure 8C:
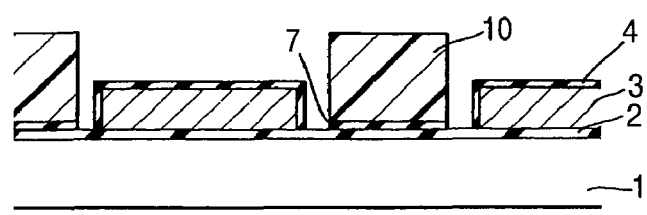
Figure 8D:
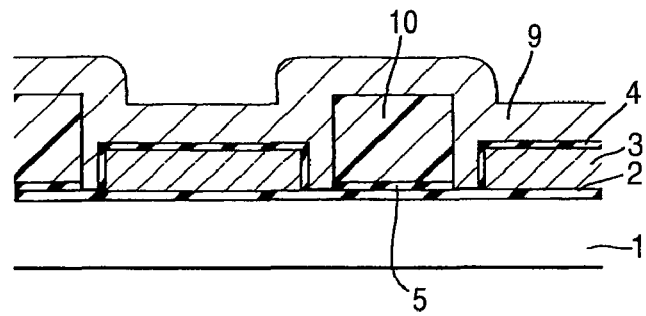
Figure 8E:
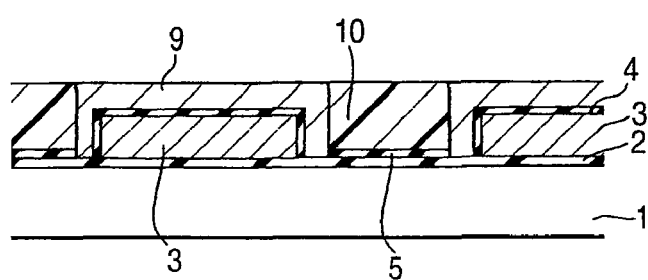

That is, a tungsten film as the light-shielding film 9 is formed by a CVD process (FIG. 7A), a resist pattern R2 is formed by photolithography (FIG. 7B), and an opening is formed in the light-shielding film 9 by using the resist pattern R2 as the mask (FIG. 7C).

Subsequently, a BPSG film is formed thereon and subjected to heat reflow to form a flattening film 10.

Furthermore, an aluminum thin film (not shown) is formed thereon by a CVD process using an organic aluminum and after patterning, organic films as a silicon nitride film 20 and a flattening film 22 are formed.

Thereafter, a color filter film 50 is formed thereon, a flattening film 61 on filter, comprising an organic film, is then formed, and a microlens 60 is further formed to obtain a solid-state imaging device shown in FIGS. 1 and 2.

According to this method, the antireflection film 7 is self-alignedly formed on the lateral wall of the charge transfer electrode and therefore, can be formed without displacement. Also, the margin is not necessary and the area can be maximally and effectively used, so that high sensitivity and high precision can be attained. Furthermore, the antireflection film is sandwiched by high-quality insulating films formed by radical oxidation with a low-temperature plasma and this enables reduction in the thickness and prevention of not only multiple reflection but also light attenuation, so that a high-precision highly reliable solid-state image device can be fabricated.

According to this method, a high-precision high-sensitivity solid-state image device can be fabricated without using an expensive exposure apparatus assured of high overlap accuracy, and the production cost can be reduced.

Also, the distance between the antireflection film and the charge transfer electrode can be easily adjusted by controlling the film thickness of the polycrystalline silicon film constituting the sidewall.

Furthermore, by virtue of applying radical oxidation using a low-temperature plasma, not only extension of the diffusion length can be prevented but also a thin and high-quality insulating film can be formed, and this contributes to the thinning and high integration of the solid-state imaging device.

In addition, the silicon oxide films 5 and 8 are formed by radical oxidation to sandwich the antireflection film and thereby cover the entire surface of the antireflection film, so that the insulation property can be enhanced and intrusion of water or the like into the substrate can be prevented. At the same time, since an impurity-blocking effect is provided, even when the flattening film is composed of BPSG, good characteristic properties can be maintained without incurring reduction in the reliability.

Also, by virtue of high passivation property, even when only an organic film is used as the flattening film thereon, the reliability can be maintained.

Embodiment 2

In Embodiment 1, on the photoelectric conversion section, the gate oxide film 2 is completely removed and a silicon oxide film 5 is formed by radical oxidation to cover the entire surface, but when the gate oxide film 2 is composed of an oxide nitride oxide (ONO) film, the antireflection film may be formed thereon.

Embodiment 3

In Embodiment 1, the silicon oxide films 5 and 8 are formed by radical oxidation to sandwich the antireflection film and thereby cover the entire surface of the antireflection film, but if slight reduction in the passivation property is allowed, either one of those silicon oxide films may be omitted.

Also, the light-shielding metal is not limited to tungsten and may be appropriately changed to titanium (Ti), cobalt (Co), nickel (Ni) or the like.

Incidentally, the production method is not limited to the above-described Embodiments but may be appropriately changed.

As described in the foregoing pages, according to the present invention, an island-like antireflection film can be easily and self-alignedly formed on a photodiode with good controllability and this enables elevation of sensitivity and reduction of smears. Therefore, the present invention is effective for the fabrication of a fine and high-sensitivity solid-state imaging device such as compact camera. Also, when a color filter material, a fluorescent agent or the like is filled in the optical waveguide path, not only color mixing can be prevented but also shrinkage in the longitudinal direction can be permitted, so that the margin for the light incident angle can be decreased.

The present application claims foreign priority based on Japanese Patent Application (JP 2005-263749) filed Sep. 12 of 2006, the contents of which is incorporated herein by reference.

What is claimed is:

1. A method for producing a solid-state imaging device, which comprises:
a photoelectric conversion section;
a charge transfer section having a charge transfer electrode for transferring an electric charge generated in the photoelectric conversion section; and
an antireflection film covering a light-receiving region in the photoelectric conversion section,
wherein
forming the antireflection film comprises:
forming a sidewall on a lateral wall of the charge transfer electrode after forming the charge transfer electrode;
forming an antireflection film on a substrate surface where the sidewall is formed;
forming a resist on the antireflection film;
melting and flattening the resist to expose the antireflection film on the charge transfer electrode;
removing the antireflection film by using the resist as the mask;
removing the sidewall;
covering the charge transfer electrode with an insulating film; and
forming a light-shielding film that reaches a level lower than the top surface of the antireflection film, and that surrounds the periphery of the antireflection film.

2. The method for producing the solid-state imaging device as claimed in claim 1, wherein the forming of the light-shielding film comprises patterning by photolithography after the forming of the light-shielding film.

3. The method for producing the solid-state imaging device as claimed in claim 1, which comprises, etching at least a part of an gate oxide film on the photoelectric conversion section by using the charge transfer electrode as the mask, the etching performing in advance of the forming of the sidewall.

4. The method for producing the solid-state imaging device as claimed in claim 3, wherein the etching of the gate oxide film is exposing the substrate surface.

5. The method for producing the solid-state imaging device as claimed in claim 4, which comprises, covering the substrate surface with an oxide film by a radical oxidation using a low-temperature plasma after the exposing of the substrate surface.

6. The method for producing the solid-state imaging device as claimed in claim 1, wherein the forming of the sidewall comprises forming a polycrystalline silicon layer by a chemical vapor deposition method.

7. The method for producing the solid-state imaging device as claimed in claim 1, wherein the forming of the insulating film comprises forming a silicon oxide film by a radical oxidation using a low-temperature plasma.

8. The method for producing the solid-state imaging device as claimed in claim 1, wherein the forming of the antireflection film is forming a silicon nitride film.

* * * * *